United States Patent
Chang et al.

(10) Patent No.: US 11,137,785 B2
(45) Date of Patent: Oct. 5, 2021

(54) ON-CHIP POWER REGULATION SYSTEM FOR MRAM OPERATION

(71) Applicant: Taiwan Semiconductor Manufacturing Company Limited, Hsinchu (TW)

(72) Inventors: Yen-An Chang, Hsinchu (TW); Chieh-Pu Lo, Hsinchu (TW); Yi-Chun Shih, Taipei (TW); Chia-Fu Lee, Hsinchu (TW); Yu-Der Chih, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 16/787,506

(22) Filed: Feb. 11, 2020

(65) Prior Publication Data
US 2021/0247789 A1    Aug. 12, 2021

(51) Int. Cl.
*G05F 1/575* (2006.01)
*G11C 11/16* (2006.01)

(52) U.S. Cl.
CPC .......... *G05F 1/575* (2013.01); *G11C 11/1697* (2013.01)

(58) Field of Classification Search
CPC ............................ G05F 1/575; G11C 11/1697
See application file for complete search history.

(56) References Cited

U.S. PATENT DOCUMENTS

| | | | |
|---|---|---|---|
| 9,046,909 B2 | 6/2015 | Leibowitz et al. | |
| 9,786,385 B2* | 10/2017 | Xu | G11C 29/50 |
| 9,910,594 B2* | 3/2018 | Rajwade | G06F 3/0604 |
| 2012/0063254 A1* | 3/2012 | Hsia | G11C 5/147 |
| | | | 365/226 |
| 2015/0270838 A1 | 9/2015 | Chan et al. | |
| 2016/0260472 A1 | 9/2016 | Xu et al. | |
| 2018/0150090 A1 | 5/2018 | Chang et al. | |

FOREIGN PATENT DOCUMENTS

| | | |
|---|---|---|
| CN | 101346773 | 1/2009 |
| CN | 103227559 | 7/2013 |
| KR | 20090066039 | 6/2009 |
| TW | 201516612 | 5/2015 |
| TW | 201818183 | 5/2018 |
| TW | 201832039 | 9/2018 |
| TW | 201833706 | 9/2018 |
| TW | 202008702 | 2/2020 |

* cited by examiner

*Primary Examiner* — Ajay Ojha
(74) *Attorney, Agent, or Firm* — Foley & Lardner LLP

(57) ABSTRACT

In an embodiment, a voltage regulation circuit includes a regulation circuit with a voltage regulator that provides an output voltage and a control circuit, coupled to the voltage regulator. The control circuit pulls up the output voltage to a reference voltage responsive to the control circuit detecting that a first voltage level of the output voltage is lower than a predefined voltage level. The control circuit decouples the output voltage from the reference voltage responsive to the control circuit detecting that the first voltage level of the output voltage is higher than the predefined voltage level.

20 Claims, 11 Drawing Sheets

ON-CHIP POWER REGULATION SYSTEM FOR MRAM OPERATION

BACKGROUND

The present application relates to a method and a circuit for voltage supply management, and more specifically, to a method and a circuit for stabilizing a low-dropout voltage.

A linear voltage regulator, e.g., a low-dropout (LDO) regulator, is typically used to provide a well-specified and stable direct-current (DC) voltage. Generally, an LDO regulator is characterized by its low dropout voltage, which refers to a small difference between respective input voltage and output voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
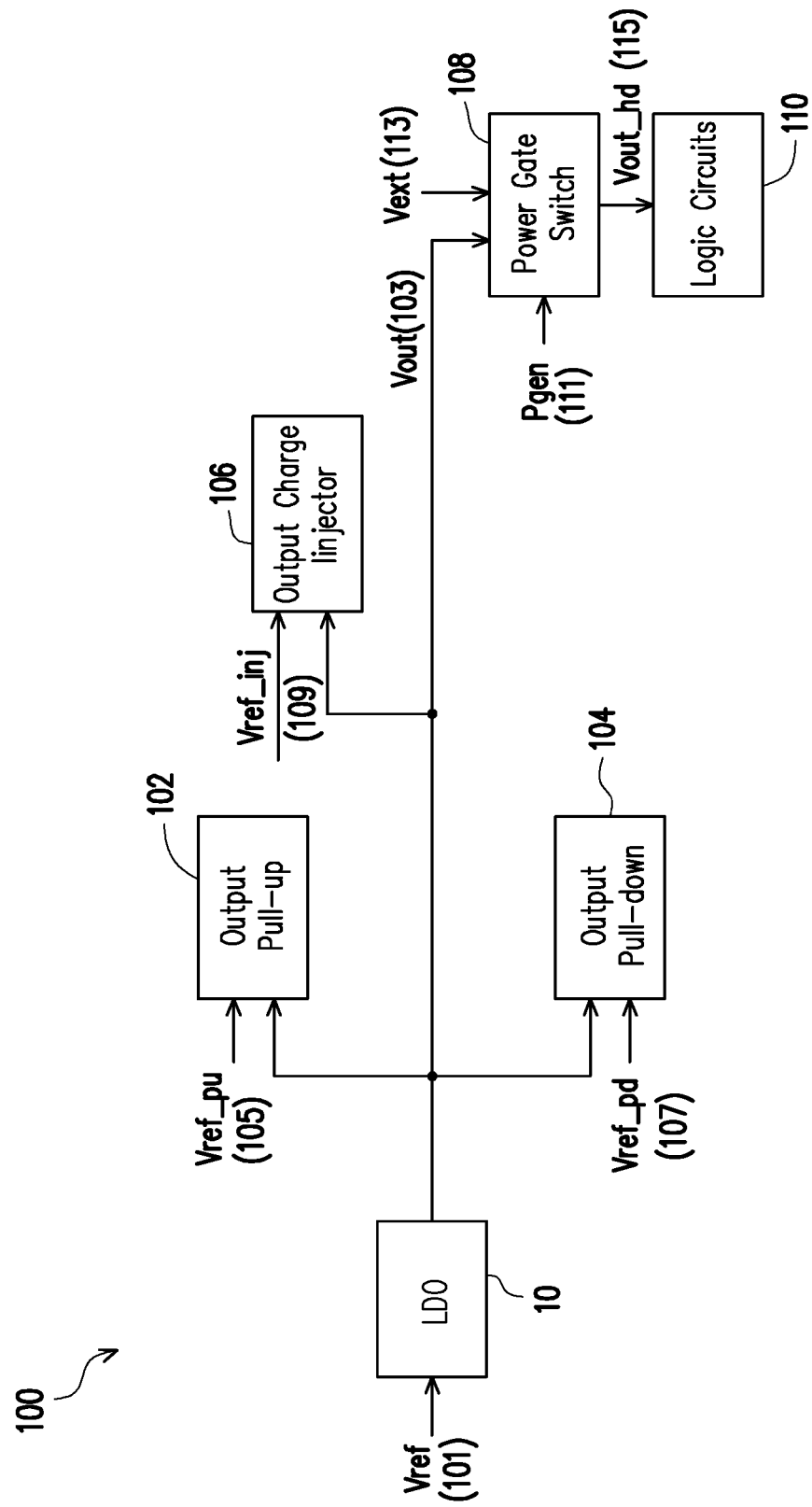
FIG. 1 illustrates an exemplary block diagram of an LDO regulator circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a low-dropout (LDO) regulator is configured to provide a well-specified and stable direct-current (DC) output voltage (e.g., a regulated output voltage) based on an input voltage (e.g., an unregulated input voltage) with a low dropout voltage. The "dropout voltage" used herein typically refers to a minimum voltage required across the (LDO) regulator to maintain the output voltage being regulated. Even though the input voltage, provided by a power source, falls to a level very near that of the output voltage and is unregulated, the LDO regulator can still produce the output voltage that is regulated and stable. Such a stable characteristic enables the LDO regulator to be used in a variety of integrated circuit (IC) applications, for example, a memory device, a power IC device, etc.

However, some applications require a high-performing LDO regulator. For example, some loads can vary in the current they sink from the LDO regulator, causing a change in the output voltage level. Some memory devices may need a word-line (WL) bias to be regulated to a narrow range (e.g., cell access window) in order to access a memory cell. Some memories devices may need a bias generator that can achieve a stable output voltage level with fast transient response for high sped operation. Some memory control logic circuits may need a regulated bias to improve low core device power (VDD) speed. Some memory devices need leakage current to be less than a predefined threshold (e.g., during idle mode and/or active mode). A traditional LDO regulator without any output assisted circuits cannot achieve a stable output voltage level with a fast transient response and a low leakage level.

For an LDO regulator to achieve a stable output voltage level with a fast transient response, one or more output level clamper sets including pull-up output stages, pull-down output stages, and/or charge injectors are provided. Each output level clamper set is configured to dynamically monitor a loading of the LDO regulator and provide a corresponding response to reduce settling time to the steady-state output voltage. Thus, the one or more output level clamper sets can advantageously shorten active mode waiting times. Advantageously, the one or more output level clamper sets suppress overshoot and undershoot to prevent semiconductor damages during memory operation. The one or more output level clamper sets can be distributed across different loads (e.g., loads, memory devices, memory banks, logic circuits, memory control logic circuits, etc.). Thus, the output voltage level can be controlled locally at the various loads, avoiding changes in local output voltage levels due to voltage (IR) drops across a lossy medium. Each of the output level clamper sets can be controlled by an active-feedback circuit.

To recover the output level during wake-up and to reduce leakage, one or more power gate switches with a two-step wake-up mechanism are provided. The "wake-up" used herein refers to a transition from an idle (e.g., idle, sleep, off, disabled) mode to an active (e.g., active, operational, on, enabled) mode. During idle mode, the output of the LDO regulator is disabled or decoupled from the load. During active mode, the output of the LDO regulator is enabled and coupled to the load. Advantageously, the power gate switches and associated two-step wake-up mechanism reduce recovery time and reduce leakage of the LDO regulator. Similar to the output level clamper sets, the power gate switches can be distributed across the loads.

FIG. 1 illustrates an exemplary block diagram of an LDO regulator circuit 100, in accordance with some embodiments. As shown, the LDO regulator circuit 100 includes the LDO regulator 10, an output pull-up circuit 102 coupled to the LDO regulator 10, an output pull-down circuit 104 coupled to the LDO regulator 10, an output charge injector 106 coupled to the LDO regulator 10, and a power gate switch 108 coupled to the LDO regulator 10. The power gate switch 108 is coupled to the logic circuits (e.g., load, memory device, memory cell, memory bank, memory control circuit, etc.) 110. In some embodiments, the LDO regulator 10 includes an operational amplifier (opamp), a p-type metal-oxide-semiconductor (PMOS) transistor coupled in feedback to the operational amplifier (such that its gate is tied to the output and its drain is tied to Vout), and an n-type metal-oxide-semiconductor (NMOS) transistor with its drain tied to Vout, a voltage biasing its gate, and its source tied to ground.

Figure 2A:
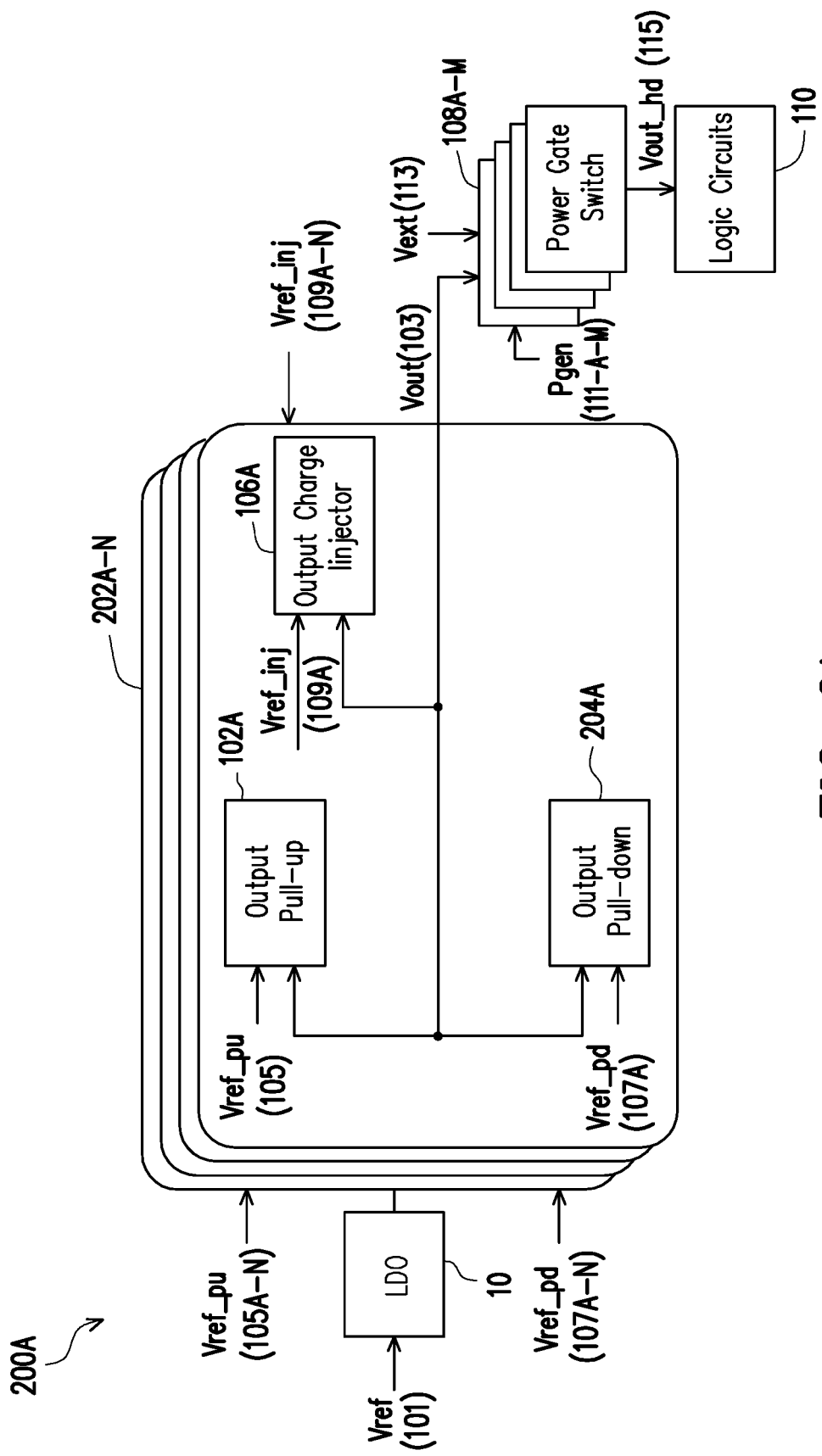
FIG. 2A illustrates an exemplary block diagram of an LDO regulator circuit, in accordance with some embodiments.

Generally, the output pull-up circuit 102, the output pull-down circuit 104, and the output charge injector 106 (collectively referred to as an output level clamper set, such as one of the output level clamper sets 202A-N with respect to FIG. 2A) are configured to assist in maintaining the output voltage at a substantially stable value while various levels of loading are each coupled to the output node 103. The output pull-up circuit 102 compares a voltage level of Vout to a voltage level of a reference pull-up voltage (Vref-pu) at its input node 105. When the voltage level of Vout is less than the voltage level of Vref-pu, the output pull-up circuit 102 increases the voltage level of Vout. When the voltage level of Vout is greater than the voltage level of Vref-pu, the output pull-up circuit 102 stops increasing the voltage level of Vout. Advantageously, this decreases settling time and prevents the voltage level from going too low, thereby protecting the LDO regulator and associated control circuits.

The output pull-down circuit 104 compares the voltage level of Vout to a voltage level of a reference pull-down voltage (Vref-pd) at its input node 107. When the voltage level of Vout is greater than the voltage level of Vref-pd, the output pull-down circuit 104 decreases the voltage level of Vout. When the voltage level of Vout is less than the voltage level of Vref-pd, the output pull-up circuit 102 stops decreasing the voltage level of Vout. Advantageously, this decreases settling time and prevents the voltage level from going too high, thereby protecting the LDO regulator and associated control circuits.

The output charge injector 106 compares the voltage level of Vout to a voltage level of a reference injector voltage (Vref-inj) at its input node 109. When the voltage level of Vout is less than the voltage level of Vref-inj, the output charge injector 106 injects charge, causing the voltage level of Vout to increase. When the voltage level of Vout is greater than the voltage level of Vref-inj, the output charge injector 106 stops injecting charge. Advantageously, this decreases settling time and prevents the voltage level from going too low, thereby protecting the LDO regulator and associated control circuits.

The power gate switch 108 is configured to wake-up the logic circuits 110 (e.g., to transition the logic circuits 110 from an idle state to an active state). At start of wake-up mechanism, based on voltage levels of one or more voltages at the input of the power gate switch 108, the load voltage (Vout_hd) at input node 115 of the logic circuits 110 is floating. When the logic state of PGEN and/or one or other voltages at control input node 111 of the power gate switch 108 transitions to a first logic state, Vout_hd is coupled to an external voltage (Vexternal) at a first signal input node 113 of the power gate switch 108. When the logic state of PGEN transitions to a second logic state, Vout_hd is coupled to Vout. Each of the first logic state and the second logic state can be one of a logic high state, a logic low state, a logic state with a voltage level of a supply voltage, or a logic state with a voltage level of ground. Advantageously, this reduces settling time and leakage level.

FIG. 2A illustrates an exemplary block diagram of an LDO regulator circuit 200A, in accordance with some embodiments. In some embodiments, the LDO regulator circuit 200A is substantially similar to the LDO regulator circuit 100. The LDO regulator circuit 200A includes the LDO regulator 10, one or more output level clamper sets 202A-N coupled to the LDO regulator 10 (e.g., N is an integer greater than or equal to 1), and one or more power gate switches 108A-M (e.g., M is an integer greater than or equal to 1 and same as or different than N) coupled to the LDO regulator 10. Each of the output level clamper sets 202A-N includes an output pull-up circuit 102, an output pull-down circuit 104, and an output charge injector 106. For example, the output level clamper set 202A includes an output pull-up circuit 102A, an output pull-down circuit 104A, and an output charge injector 106A. The logic circuits 110 is coupled to the one or more power gate switches 108A-M.

Advantageously, the LDO regulator circuit 200A offers flexibility in clamping, charge injecting, and switching ability. In some embodiments, the multiple output pull-up circuits 102A-N can share one common Vref_pu or have a dedicated Vref_pu at their respective inputs 105A-N. For example, Vref_pu at the input node 105A can have a different voltage level than Vref_pu at the input node 105B. Thus, a different number of output pull-up circuits are enabled (e.g., enabled triggered, activated, etc.) depending on a voltage level of Vout. Likewise, the multiple output pull-down circuits 104A-N can share one common Vref_pd or have a dedicated Vref_pd at their respective inputs 107A-N. As a number of output pull-up circuits and/or output pull-down circuits that are enabled increases, a voltage (IR) drop across the enabled output pull-up circuits and/or enabled output pull-down circuits decreases.

In some embodiments, the output charge injectors 106A-N can share one common Vref_inj or have a dedicated Vref_inj at their respective inputs 109A-N. As a number of output charge injectors that are enabled increases, more charge is injected and, thus, the voltage level of Vout increases at a faster rate. In some embodiments, the one or more power gate switches 108A-M can have a dedicated PGEN at their respective inputs 111A-M. Thus, the logic states can be set individually for each power gate switch 108, thereby controlling a number of power gate switches that are enabled to wake-up the logic circuits 110. As a number of power gate switches that are enabled increases, a voltage (IR) drop across the enabled power gate switches decreases.

In some embodiments, the output clamper level sets 202A-N and/or the power gate switches 108A-M can be distributed across multiple logic circuits 110. The distributed scheme is described further with respect to FIG. 7.

Figure 2B:
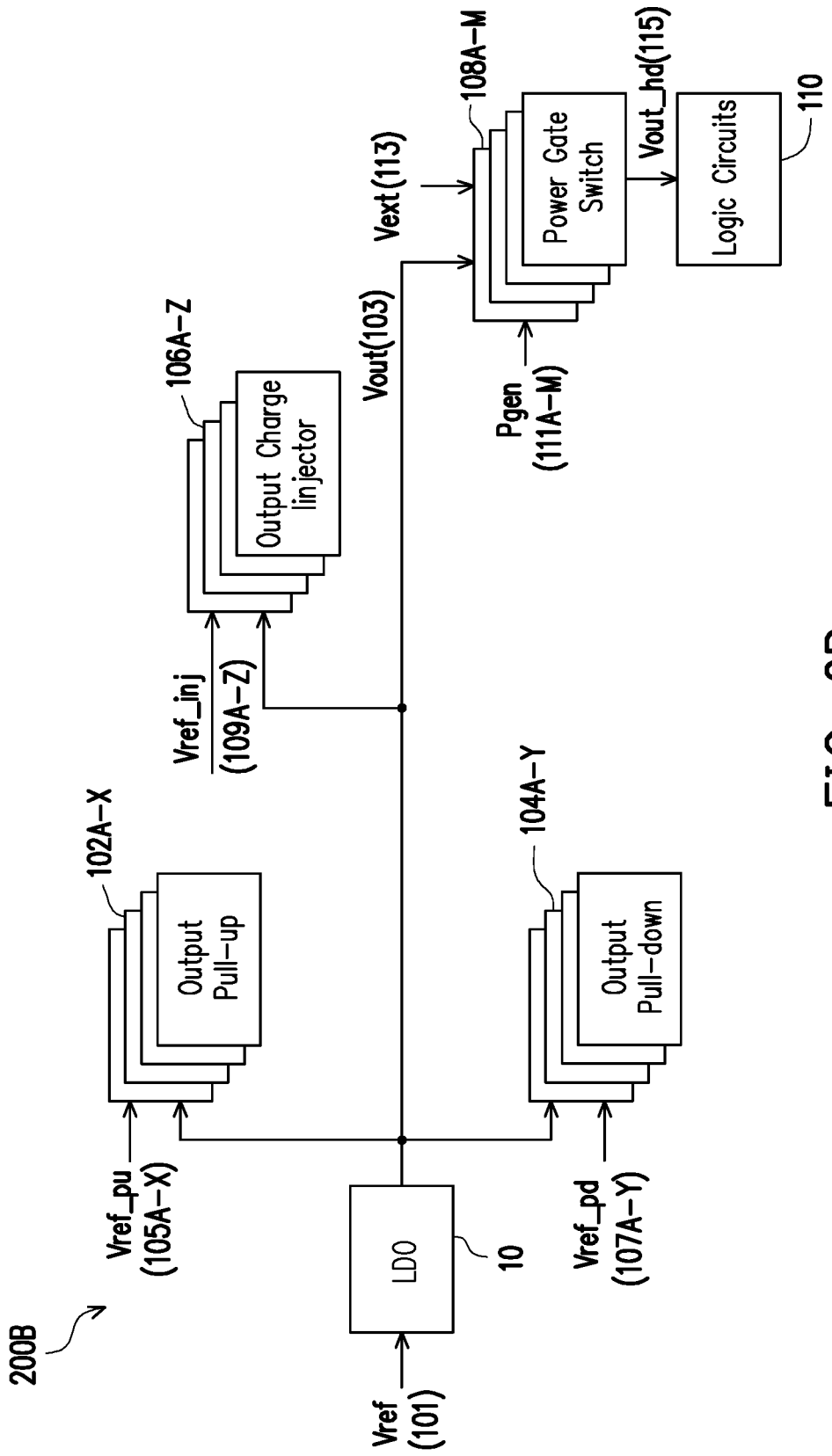
FIG. 2B illustrates an exemplary block diagram of an LDO regulator circuit, in accordance with some embodiments.

FIG. 2B illustrates an exemplary block diagram of an LDO regulator circuit 200B, in accordance with some embodiments. In some embodiments, the LDO regulator circuit 200B is substantially similar to the LDO regulator circuit 200A. The LDO regulator circuit 200B includes the LDO regulator 10, one or more output pull-up circuits 102A-X coupled to the LDO regulator 10 (e.g., X is an integer greater than or equal to 1), one or more output pull-down circuits 104A-Y coupled to the LDO regulator 10 (e.g., Y is an integer greater than or equal to 1, and same or different than X), one or more output charge injectors 106A-Z coupled to the LDO regulator 10 (e.g., Z is an integer greater than or equal to 1, and same as or different than X or Y), and the one or more power gate switches 108A-M coupled to the LDO regulator 10. The logic circuits 110 is coupled to the one or more power gate switches 108A-M. The LDO regulator circuit 200B offers even more flexibility than the LDO regulator circuit 200A in that each set (e.g., the output pull-up circuits 102A-X, the output pull-down circuits 104A-Y, and the output charge injectors 106A-Z) can include a different number of devices (e.g., X, Y, and Z can all be different integers). Like in FIG. 2A, devices from each set can share one common or have a dedicated voltage (e.g., a dedicated Vref_pu, Vref_pd, or Vref_inj) at their respective inputs (e.g., inputs 105A-X, 107A-Y, or 109A-Z).

In some embodiments, the output pull-up circuits 102A-X, the output pull-down circuits 104A-Y, the output charge injectors 106A-Z, and/or the power gate switches 108A-M can be distributed across multiple logic circuits 110. The distributed scheme is described further with respect to FIG. 7.

Figures 3A, 3B:
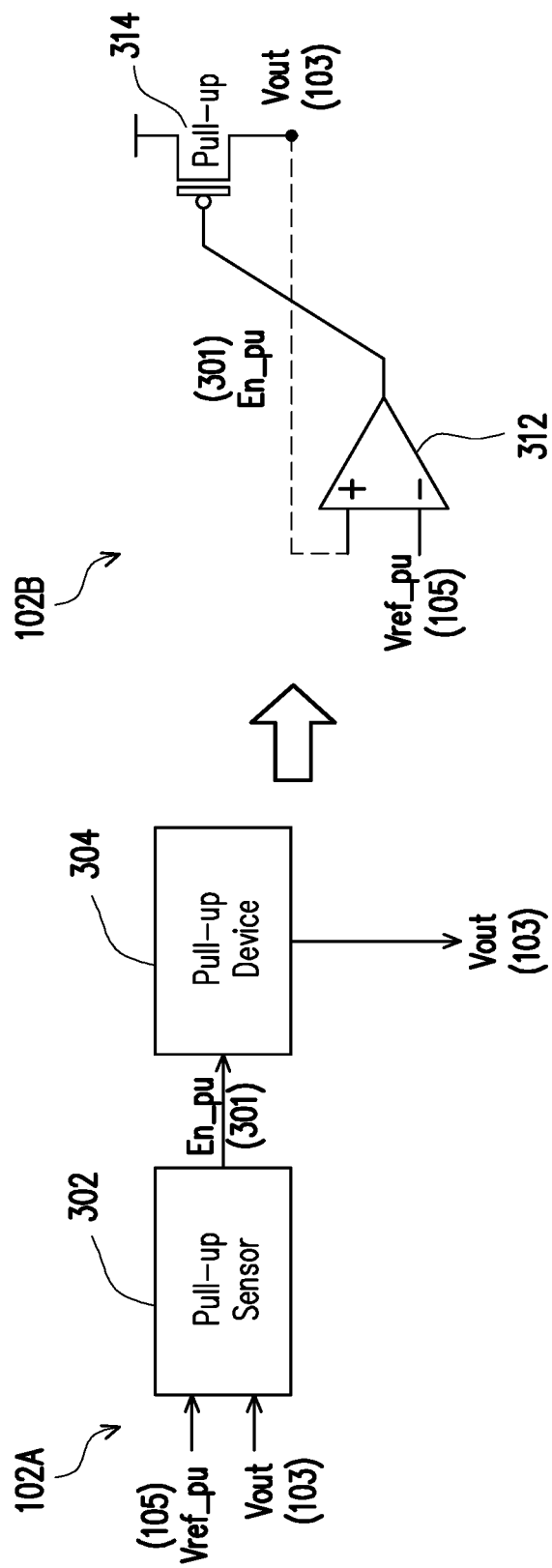
FIG. 3A illustrates an exemplary block diagram of an output pull-up circuit, in accordance with some embodiments.
FIG. 3B illustrates an exemplary block diagram of an output pull-up circuit, in accordance with some embodiments.

FIG. 3A illustrates an exemplary block diagram of an output pull-up circuit 102A, in accordance with some embodiments. The output pull-up circuit 102A includes a pull-up sensor 302 and a pull-up device 304 coupled to the pull-up sensor 302. The pull-up sensor 302 compares Vout to Vref_pu. The pull-up sensor 302 generates an error/enable signal (En_pu) at its output node 301 based on the comparison of Vref_pu and Vout (e.g., a multiple of a difference between Vref_pu and Vout). When Vout is less than Vref_pu, En_pu has a first logic state (e.g., low logic state, low voltage level, ground rail). When Vout is greater than Vref_pu, En_pu has a second logic state (e.g., high logic state, high voltage level, supply rail). The signal En_pu drives the pull-up device 304. When En_pu is the first logic state, the pull-up device 304 is in a first state, e.g., couples (e.g., couples, pulls up, maintains coupling of) Vout to a predefined (e.g., reference, predefined, fixed, adjustable, supply, ground, logic level, output of resistor ladder, etc.) voltage. When En_pu is the second logic state, the pull-up device 304 is in a second state, e.g., decouples or maintains decoupling of Vout from the predefined voltage.

FIG. 3B illustrates an exemplary block diagram of an output pull-up circuit 102B, in accordance with some embodiments. In some embodiments, the output pull-up circuit 102B is substantially similar to the output pull-up circuit 102A. As shown in FIG. 3B, the pull-up sensor 302 is implemented as, or includes, an operational amplifier (e.g., an operational amplifier, opamp, error amplifier, comparator, etc.) 312, and the pull-up device 304 is implemented as, or includes, a p-type metal-oxide-semiconductor (PMOS) transistor 314.

The output voltage Vout, at a first (e.g., non-inverting) terminal of the opamp 312, is controlled by the Vref_pu at a second (e.g., inverting) input terminal of the opamp 312. More specifically, when a voltage level of Vout increases to a level greater than Vref_pu, the error voltage (e.g., En_pu) generated by the opamp 312 and received by a gate of the PMOS transistor 314 increases until clipping at a first voltage level (e.g., a supply rail of the opamp 312) indicative of a first logic state. The increase in the error voltage reduces a source-gate voltage (Vsg) of the PMOS transistor 314 to a value below a cut-off voltage of the PMOS transistor 314 such that a channel of the PMOS transistor 314 between the source and drain is not conducting, thereby decoupling the predefined voltage (at the source node of the PMOS 314) and Vout (at the drain node of the PMOS 314). Through an opposite mechanism, when the voltage level of Vout decreases to a level less than Vref_pu, the error voltage decreases until clipping at a second voltage level (e.g., a ground rail of the opamp 312) indicative of a second logic state. The decrease in the error voltage increases the Vsg of the PMOS transistor 314 to a value above the cut-off voltage of the PMOS transistor 314 such that a channel of the PMOS transistor 314 between the source and drain is conducting, thereby coupling the predefined voltage and Vout. In other words, the opamp 312 interacts with the PMOS transistor 314 to clamp Vout to a predefined voltage when the voltage level of Vout drops below the value of Vref_pu, preventing damage to semiconductors (e.g., the voltage regulator, the control circuits, and the load), and reducing settling time.

Figures 4A, 4B:
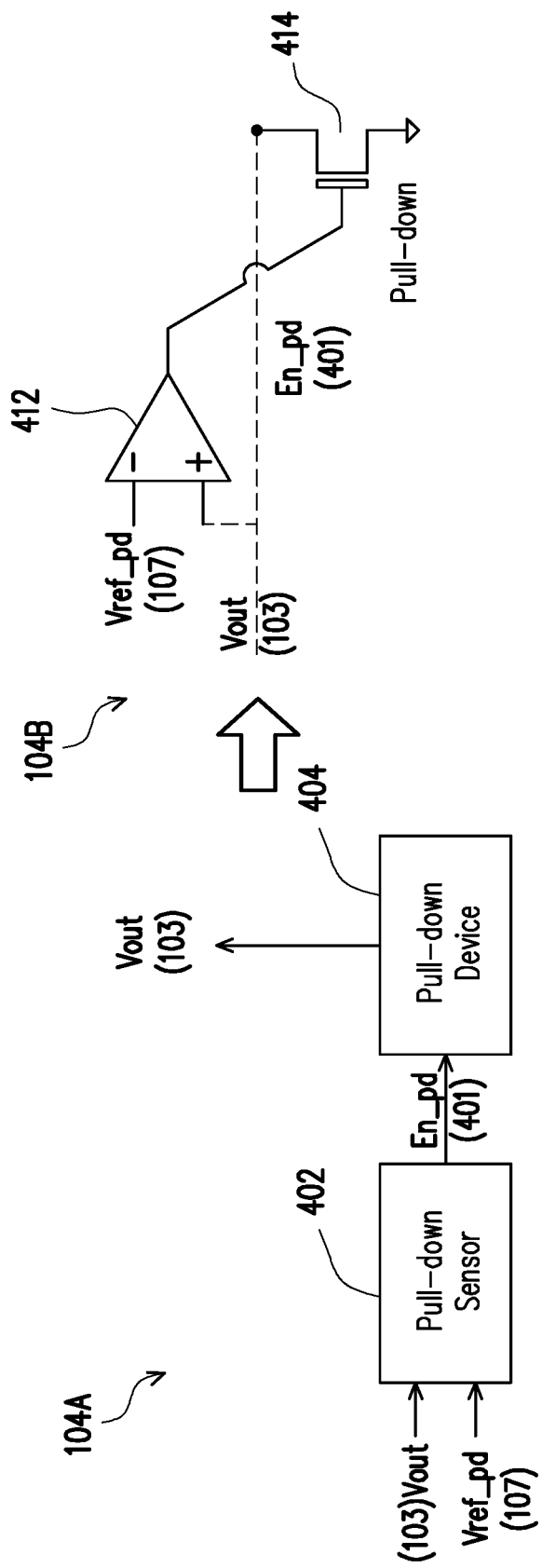
FIG. 4A illustrates an exemplary block diagram of an output pull-down circuit, in accordance with some embodiments.
FIG. 4B illustrates an exemplary block diagram of an output pull-down circuit, in accordance with some embodiments.

FIG. 4A illustrates an exemplary block diagram of an output pull-down circuit 104A, in accordance with some embodiments. The output pull-down circuit 104A includes a pull-down sensor 402 and a pull-down device 404 coupled to the pull-down sensor 402. The pull-down sensor 402 compares Vout to Vref_pd. The pull-down sensor 402 generates an error/enable signal (En_pd) at its output node 401 based on the comparison of Vref_pd and Vout (e.g., a multiple of a difference between Vref_pd and Vout). When Vout is greater than Vref_pd, En_pd has a first logic state (e.g., high logic state, supply rail). When Vout is less than Vref_pd, En_pd has a second logic state (e.g., low logic state, ground rail). The signal En_pd drives the pull-down device 404. When En_pd is the first logic state, the pull-down device 404 is in a first state, e.g., couples (e.g., couples, pulls down, maintains coupling of) Vout to a predefined voltage. When En_pd is the second logic state, the pull-down device 404 is in a second state, e.g., decouples or maintains decoupling of Vout from the predefined voltage.

FIG. 4B illustrates an exemplary block diagram of an output pull-down circuit 104B, in accordance with some embodiments. In some embodiments, the output pull-down circuit 104B is substantially similar to the output pull-down circuit 104A. As shown in FIG. 4B, the pull-down sensor 402 is implemented as, or includes, an opamp 412, and the pull-down device 404 is implemented as, or includes, a n-type metal-oxide-semiconductor (NMOS) transistor 414.

The output voltage Vout, at the first (e.g., non-inverting) input terminal of the opamp 412, is controlled by the Vref_pd at one (e.g., inverting) input terminal of the opamp 412. More specifically, when a voltage level of Vout decreases to a level less than Vref_pd, the error voltage (e.g., En_pd) generated by the opamp 412 and received by a gate of the NMOS transistor 414 decreases until clipping at a first voltage level (e.g., a ground rail of the opamp 412) indicative of a first logic state. The decrease in the error voltage reduces a gate-source voltage (Vgs) of the NMOS transistor 414 to a value below a cut-off voltage of the NMOS transistor 414 such that a channel of the NMOS transistor 414 between the source and drain is not conducting, thereby decoupling the predefined voltage and Vout. Through an opposite mechanism, when the voltage level of Vout increases to a level greater than Vref_pd, the error voltage increases until clipping at a second voltage level (e.g., a supply rail of the opamp 412) indicative of a second logic state. The decrease in the error voltage increases the Vgs of the NMOS transistor 414 to a value above the cut-off voltage of the NMOS transistor 414 such that a channel of the NMOS transistor 414 between the source and drain is conducting, thereby coupling the predefined voltage and Vout. In other words, the opamp 412 interacts with the NMOS transistor 414 to clamp Vout to a predefined voltage when the voltage level of Vout rises above the value of Vref_pd, preventing damage to semiconductors and reducing settling time.

Figures 5A, 5B:
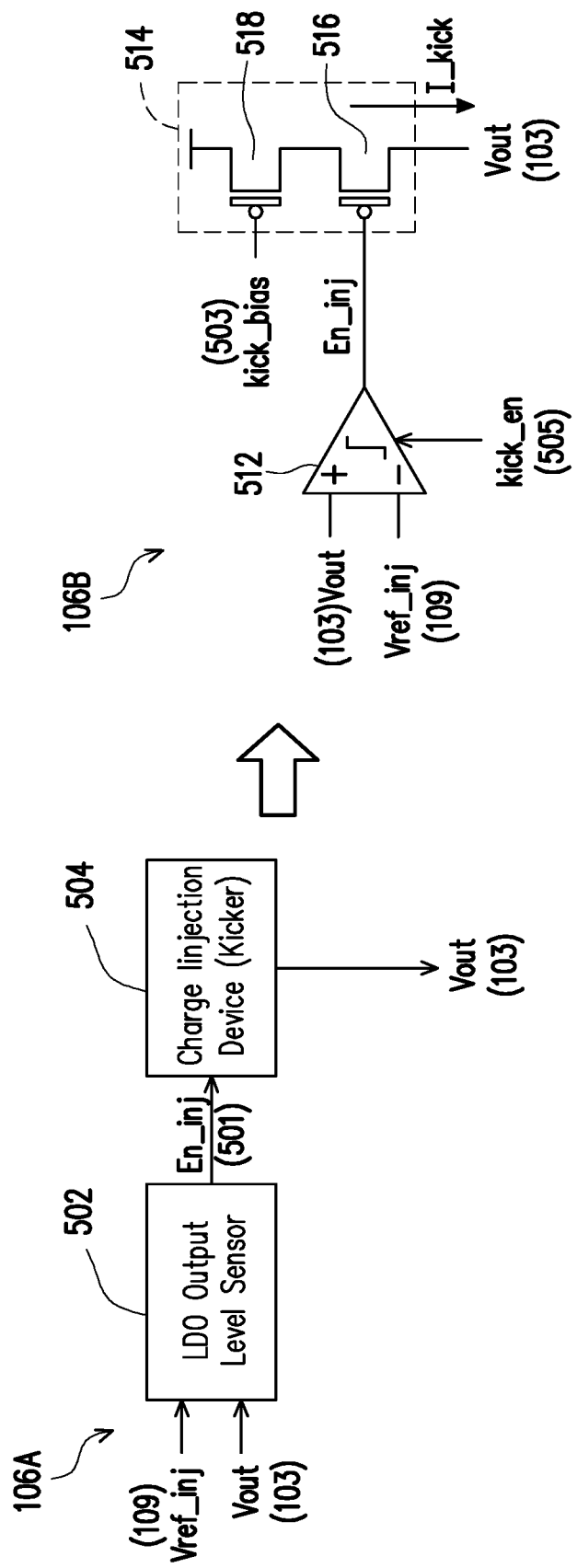
FIG. 5A illustrates an exemplary block diagram of a charge injector, in accordance with some embodiments.
FIG. 5B illustrates an exemplary block diagram of a charge injector, in accordance with some embodiments.

FIG. 5A illustrates an exemplary block diagram of a charge injector 106A, in accordance with some embodiments. The charge injector 106A includes an LDO output level sensor 502 and a charge injection driver (e.g., driver, kicker) 504 coupled to the LDO output level sensor 502. The LDO output level sensor 502 generates an error/enable signal (En_inj) at its output node 501 based on the comparison of Vref_inj and Vout (e.g., a multiple of a difference between Vref_inj and Vout). When Vout is greater than Vref_inj, En_inj has a first logic state (e.g., high logic state, supply rail). When Vout is less than Vref_inj, En_inj has a second logic state (e.g., low logic state, ground rail). The signal En_inj drives the charge injection driver 504. When En_inj is the second logic state, the charge injection driver 504 is in a second state, e.g., injects charge into the node 103 associated with Vout. When En_inj is the first logic state, the charge injection driver 504 is in a first state, e.g., ceases to inject charge into the node 103 associated with Vout.

FIG. 5B illustrates an exemplary block diagram of a charge injector 106B, in accordance with some embodiments. In some embodiments, the charge injector 106B is substantially similar to the charge injector 106A. As shown in FIG. 5B, the LDO output level sensor 502 is implemented as, or includes, an opamp 512. In some embodiments, the opamp 512 is enabled or disabled by a kick_en at a control input 505 of the opamp 512. As shown in FIG. 5B, the charge injection driver 504 is implemented as, or includes, one or more injector cores 514A-N. Each injector core 514 includes a PMOS transistor 516 and a PMOS transistor 518. In some embodiments, the PMOS transistor 516 behaves as a current source and the PMOS transistor 518 behaves as a bias and/or a controllable degeneration device. In some embodiments, the PMOS transistor 518 is controlled by a kick_bias at a gate node 503 of the PMOS transistor 518.

The output voltage Vout, at a first (e.g., non-inverting) input terminal of the opamp 512, is controlled by the Vref_kick at a second (e.g., inverting) input terminal of the opamp 512. More specifically, when a voltage level of Vout increases to a level greater than Vref_kick, the error voltage (e.g., En_inj) received by a gate of the PMOS transistor 516 increases until clipping at a first voltage level (e.g., at a supply rail of the opamp 512) indicative of a first logic state. The increase in the En_inj reduces Vsg of the PMOS transistor 516 to a value below a cut-off voltage of the PMOS transistor 516 such that a channel of the PMOS transistor 516 between the source and drain is not conducting. Accordingly, the PMOS transistor 516 does not source current to the node 103 associated with Vout. As a result, the voltage level of Vout is not increased by a charge injection (e.g., a sourcing of current) by the PMOS transistor 516. Through an opposite mechanism, when the voltage level of Vout decreases to a level less than Vref_kick, the error voltage decreases until clipping at a second voltage level (e.g., at a ground rail of the opamp 512) indicative of a second logic state. The decrease in the error voltage increases the Vsg of the PMOS transistor 516 to a value above the cut-off voltage of the PMOS transistor 516 such that a channel of the PMOS transistor 516 between the source and drain is conducting. Accordingly, the PMOS transistor 516 sources current to the node 103 associated with Vout. As a result, the voltage level of Vout is increases due to the charge injection by the PMOS transistor 516. In other words, the opamp 512 interacts with the PMOS transistor 516 to inject charge when the voltage level of Vout drops below the value of Vref_kick, preventing damage to semiconductors and reducing settling time.

Figures 6A, 6B:
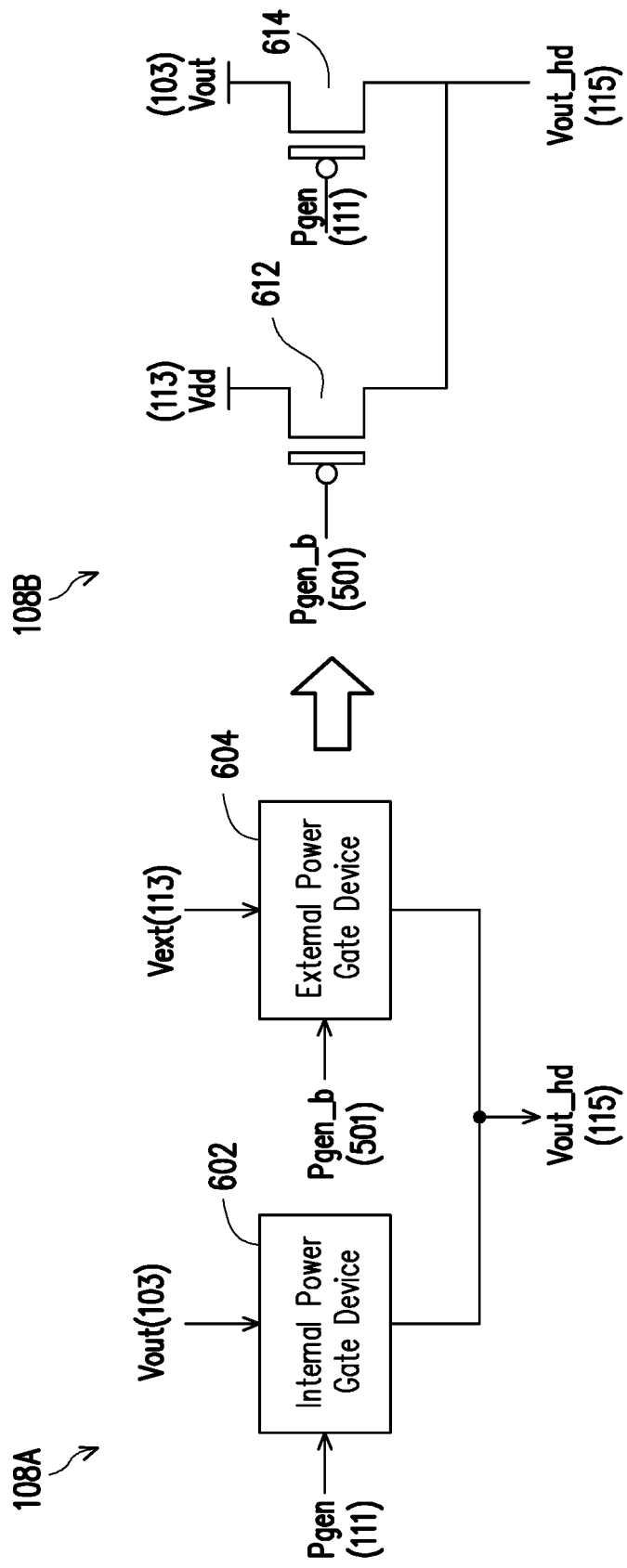
FIG. 6A illustrates an exemplary block diagram of a power gate switch, in accordance with some embodiments.
FIG. 6B illustrates an exemplary block diagram of a power gate switch, in accordance with some embodiments.

FIG. 6A illustrates an exemplary block diagram of a power gate switch 108A, in accordance with some embodiments. The power gate switch 108A includes an internal power gate device 602 and an external power gate device 604 coupled to the internal power gate device 602. The internal power gate device 602 is controlled by a logic state of PGEN at its control input 111. When PGEN is at, or transitions to, a first logic state (e.g., low logic state), Vout_hd at the input node 115 of the logic circuits 110 is coupled, via the internal power gate device 602, to Vout at the output node 103 of the LDO regulator. When PGEN is at, or transitions to, a second logic state (e.g., high logic state), Vout_hd at the input node of the logic circuits 110 is decoupled from Vout. The external power gate device 604 is controlled by a logic state of PGEN_B at its control input 501. When PGEN_B is at, or transitions to, a first logic state (e.g., low logic state), Vout_hd is coupled, via the external power gate device 604, to an external supply voltage Vdd (e.g., Vdd, Vext) at an output node 113 of an external supply (e.g., external supply circuit, unregulated supply, battery, output of resistor ladder, etc.). When PGEN_B is at, or transitions to, a second logic state (e.g., high logic state), Vout_hd at the input node 115 of the logic circuits 110 is decoupled from Vdd.

In some embodiments, the power gate switch 108A wakes-up the logic circuits 110 (e.g., supplies the regulated Vout) through a series of states. In a first state, a logic state of PGEN and PGEN_B are (e.g., the voltage levels are indicative of) a high logic state and Vout_hd is floating, thereby reducing leakage. In a second state, PGEN_B is transitioned to a low logic state, coupling Vout_hd to Vdd. In a third state, PGEN_B is transitioned to a high logic state, decoupling Vout_hd from Vdd, and PGEN is transitioned to a low logic state, coupling Vout_hd to Vout.

FIG. 6B illustrates an exemplary block diagram of a power gate switch 108B, in accordance with some embodiments. In some embodiments, the power gate switch 108B is substantially similar to the power gate switch 108A. As shown in FIG. 6B, the internal power gate device 602 is implemented as, or includes, a PMOS transistor 612, and, the external power gate device 604 is implemented as, or includes, an a PMOS transistor 614. The enable signal PGEN is received by a gate node 111 of the PMOS transistor 614 and controls whether Vout_hd is coupled to Vout. A high logic state of PGEN causes a Vsg of the PMOS transistor 614 to have a value below a cut-off voltage of the PMOS transistor 614 such that a channel of the PMOS transistor 614 between the source and drain is not conducting, thereby decoupling Vout_hd and Vout. A low logic state of PGEN causes a Vsg of the PMOS transistor 614 to have a value above the cut-off voltage of the PMOS transistor 614 such that a channel of the PMOS transistor 614 between the source and drain is conducting, thereby coupling Vout_hd and Vout. Through a similar mechanism, the enable signal PGEN_B received by a gate node 501 of the PMOS transistor 612 and controls whether Vout_hd is coupled to Vdd. A high logic state of PGEN_B causes a Vsg of the PMOS transistor 612 to have a value below a cut-off voltage of the PMOS transistor 612 such that a channel of the PMOS transistor 612 between the source and drain is not conducting, thereby decoupling Vout_hd and Vdd. A low logic state of PGEN_B causes a Vsg of the PMOS transistor 612 to have a value above the cut-off voltage of the PMOS transistor 612 such that a channel of the PMOS transistor 612 between the source and drain is conducting, thereby coupling Vout_hd and Vdd. In other words, the PMOS transistors 614 and 612 facilitate transitioning the logic circuits 110 from a low power mode to an active mode in a manner that reduces recovery time (e.g., time to transition from low power mode to active mode) and prevents leakage.

Figure 7:
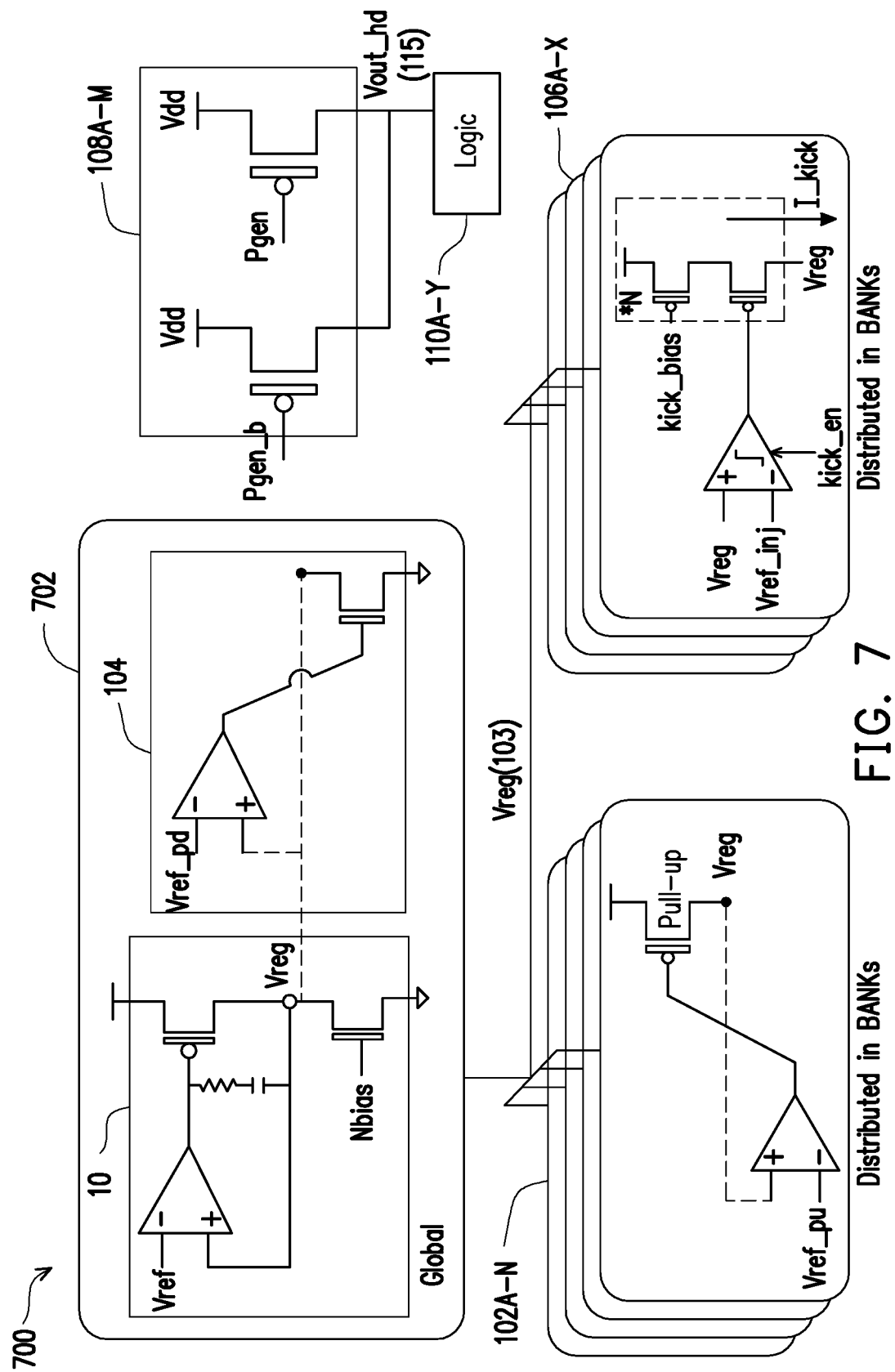
FIG. 7 illustrates an exemplary block diagram of a single on-chip power regulation system.

FIG. 7 illustrates an exemplary block diagram of a single on-chip power regulation system 700. The single on-chip power regulation system 700 can regulate power across multiple instances of the logic circuits 110A-Y (e.g., multiple memory banks of one or more memory arrays). The single on-chip power regulation system 700 includes a global LDO regulator 702, a distribution of output pull-up circuits 102A-N, a distribution of charge injectors 106A-X, and a distribution of power gate switches 108A-M. The global LDO regulator 702 includes an LDO regulator 10 and an output pull-down circuit 104.

The selected control circuits (e.g., the output pull-up circuits 102A-N, the charge injectors 106A-X, and/or the power gate switches 108A-M) are coupled to the multiple logic circuits 110A-Y. For each logic circuits 110, one or more selected control circuit instances are dedicatedly coupled (e.g., more closely coupled, in a closer proximity) to the particular logic circuits 110. For example, a first output pull-up circuit 102A, a first charge injector 106A, and a first power gate switch 108A are dedicatedly coupled to a first logic circuits 110A, and a second output pull-up circuit 102B, a second charge injector 106B, and a second power gate switch 108B are dedicatedly coupled to a second logic circuits 110B. In some embodiments, for some or all of the selected control circuit types, more than one number of those types can be dedicatedly coupled to a particular logic circuits 110. Advantageously, dedicatedly coupling selected control circuits to particular logic circuits 110 reduces a distance between the dedicated selected control circuit (e.g., the output pull-up device 102) and the particular logic circuits 110, thereby reducing an IR drop from Vout at the dedicated selected control circuit output node 103 to Vout_hd at the particular logic circuits 110 input node 115.

Figure 8:
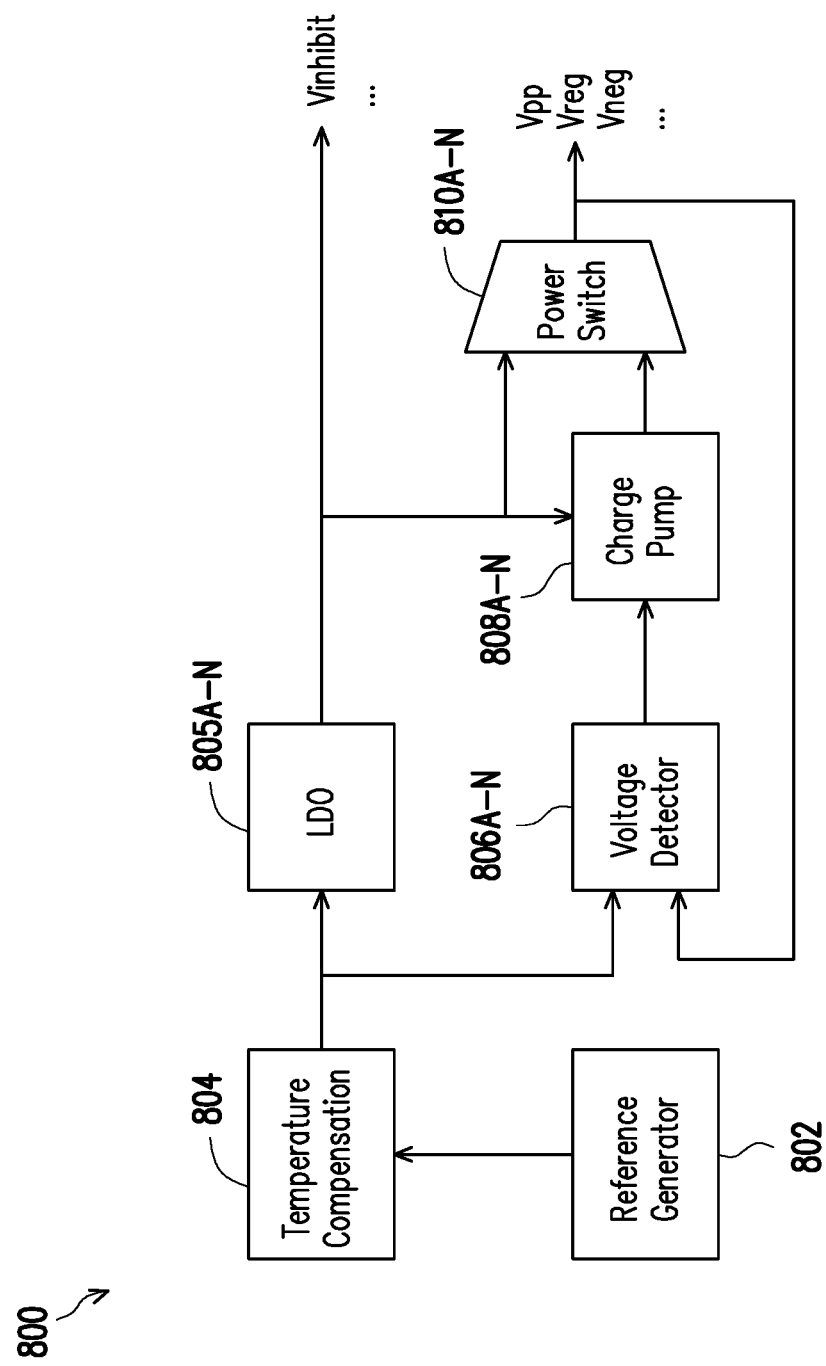
FIG. 8 illustrates an exemplary block diagram of multiple on-chip powers regulation system.

FIG. 8 illustrates an exemplary block diagram of multiple on-chip powers regulation system 800. The system 800 includes one or more LDO systems 805A-N. In some embodiments, the one or more LDO systems 805A-N include one or more of the LDO regulator circuit 100 of FIG. 1, the LDO regulator circuit 200A of FIG. 2A, the LDO regulator circuit 200B of FIG. 2B, or the single on-chip power regulation system 700 of FIG. 7. For example, each LDO system of the LDO systems 805A-N includes an instance of the LDO regulator circuit 100. In another example, the LDO system 805A includes an instance of the LDO regulator circuit 100 and the LDO system 805B includes an instance of the LDO regulator circuit 200B. The multiple on-chip powers regulation system 800 is configured to selectably generate at least one of various supply voltages. The multiple on-chip powers regulation system 800 further includes a reference generator 802 for generating a reference (e.g., bandgap reference) signal (e.g., voltage or current). The system 800 further includes a temperature compensation circuit, described with respect to FIG. 9. The system 800 further includes one or more voltage detectors 806A-N coupled to the corresponding one of the one or more LDO systems 805A-N, one or more charge pumps 808A-N coupled to the corresponding one of the one or more LDO systems 805A-N and voltage detectors 806A-N, and one or more power switches 810A-N coupled to the corresponding one of the one or one of the one or more LDO systems 805A-N and voltage detectors 806A-N.

In some embodiments, the voltage detector 806 generates a signal (e.g., a voltage, a current, a pulse width-modulated signal) based on a difference of two voltages (e.g., a difference of an output voltage of temperature compensation circuit 804 and an output voltage of the power switch 810). In some embodiments, the charge pump generates an output voltage by charging or discharging a storage element (e.g., capacitor) based on two voltages (e.g., an output voltage of the LDO system 805 and an output voltage of the voltage detector 806). In some embodiments, the charge pump generates a negative voltage. In some embodiments, the power switch selects between two voltages (e.g., the output voltage of the LDO system 805 and the output voltage of the charge pump 808).

In some embodiments, the multiple on-chip powers regulation system 800 generates at least one of a write WL bias voltage (Vpp), a read WL bias voltage (Vreg), a negative WL bias voltage (Vneg), or an unselect column bias voltage (Vinhibit). In some embodiments, the two sets of circuits generate two different voltages (e.g., simultaneously). For example, a first LDO system 805A, a first voltage detector 806A, the reference generator 802, the temperature compensation circuit 804, a first charge pump 808A, and a first power switch 810A interact to generate at least one of Vpp, Vreg, Vneg, and Vinhibit, and the reference generator 802, the temperature compensation circuit 804, a second LDO system 805B, a second voltage detector 806A, a second charge pump 808B, and a second power switch 810B interact to generate at least a second one of Vpp, Vreg, Vneg, and Vinhibit. In some embodiments, one set of circuits generate a first voltage at a first time and a second voltage different from the first voltage at the second time. For example, the reference generator 802, the temperature compensation circuit 804, the first LDO system 805A, the first voltage detector 806A, the first charge pump 808A, and the first power switch 810A interact to generate at least one of Vpp, Vreg, Vneg, and Vinhibit at a first time and at least a second one of Vpp, Vreg, Vneg, and Vinhibit at a second time.

Figure 9:
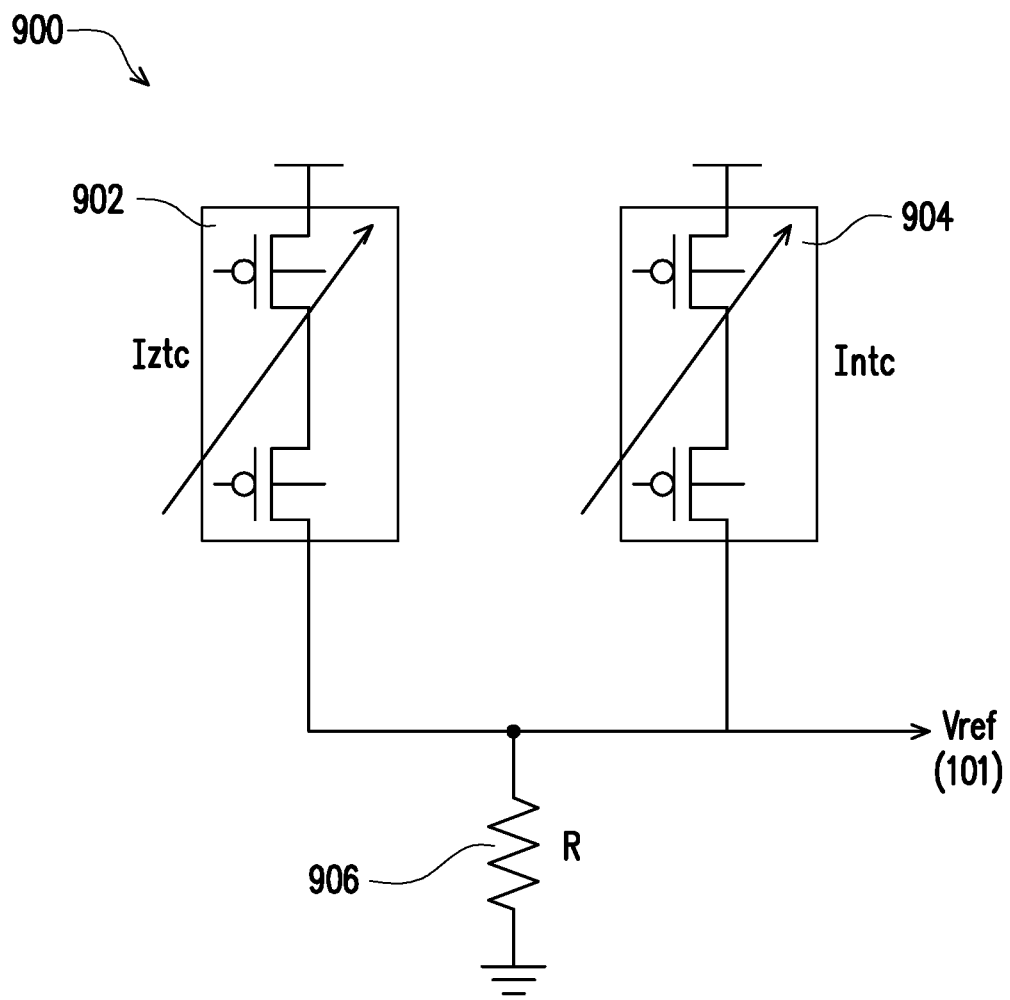
FIG. 9 illustrates an exemplary block diagram of a temperature compensation circuit.

FIG. 9 illustrates an exemplary block diagram of a temperature compensation circuit 900. The temperature compensation circuit 900 generates a voltage reference (Vref) at an input node 101 of the LDO system 805. Vref is temperature compensated so that a voltage level of Vref is not substantially changed (e.g., changes less than 50%) across temperature. The temperature compensation circuit 900 includes a first branch of transistors (e.g., NMOS or PMOS) 902, a second branch of transistors 904 coupled to the first branch of transistors 902, and a resistive element (e.g., resistor) 906 coupled to the first branch of transistors 902 and the second branch of transistors 904. The first branch of transistors 902 sources a zero-temperature coefficient current (Iztc) into the resistive element 906 and the second branch of transistors 904 sources a negative temperature coefficient current (Intc) into the resistive element 906, generating the Vref voltage level across the resistive element 906. The Vref voltage level is coupled to the LDO system 805. In some embodiments, an amount of current sourced by the two branches 902 and 904 is adjustable. The following equation represents the relationship between Iztc, Intc, the resistive element (R), Vref, and a portion of the current being sourced from the first branch (X):

$$V_{ref}=(X \times I_{ztc}+(1-X) \times I_{ntc}) \times R$$

Figure 10:
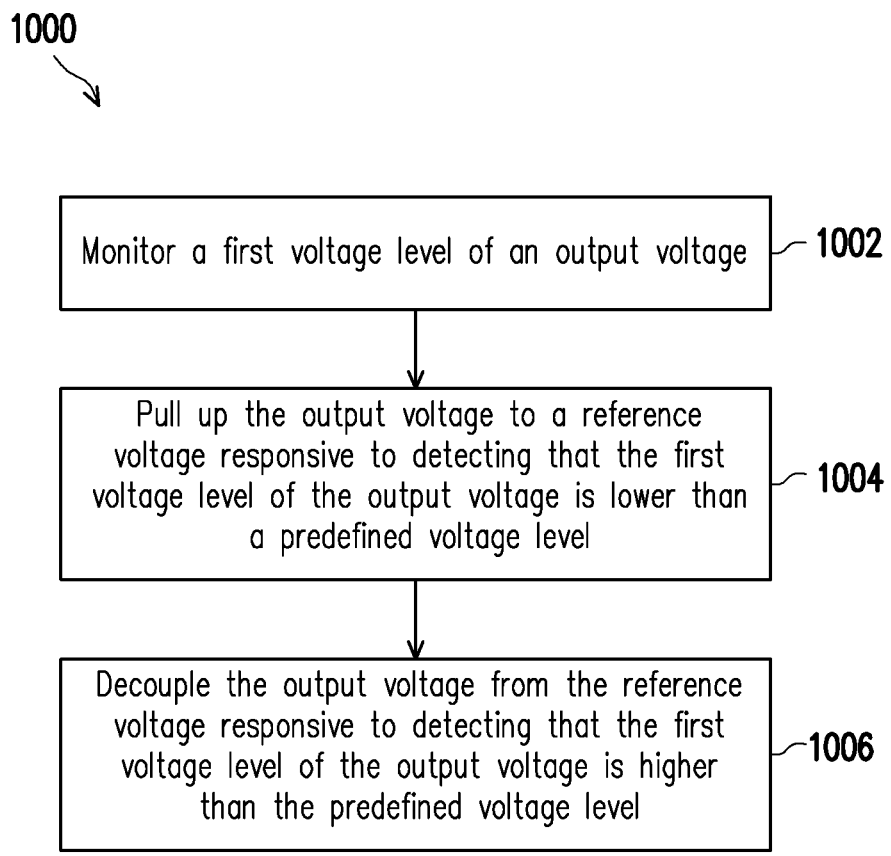
FIG. 10 illustrates a flow chart of a method for controlling a voltage regulator, in accordance with some embodiments.

FIG. 10 illustrates a flow chart of a method 1000 for controlling a voltage regulator, in accordance with some embodiments. Additional, fewer, or different operations may be performed in the method 1000 depending on the embodiment. The method 1000 is applicable to (e.g., implemented using) the circuits and systems of FIGS. 1-9, but is also applicable to other suitable circuits and systems.

A control circuit (e.g., the LDO regulator circuit 200, one of the output level clamper sets 202A-N, the output pull-up circuit 102, etc.) monitors a first voltage level of an output voltage, e.g., Vout (1002). The control circuit pulls up the output voltage to a reference voltage (e.g., supply voltage) responsive to detecting that the first voltage level of the output voltage is lower than a predefined voltage level, e.g., voltage level of Vref_pu (1004). The control circuit decouples the output voltage from the reference voltage responsive to detecting that the first voltage level of the output voltage is higher than the predefined voltage level (1006). In some embodiments, the control circuit compares the first voltage level and the predefined voltage level, and generates, based on the comparison, a sensor output signal (e.g., En_pu) having either a first logic state and a second logic state. The control circuit pulls up the output voltage to the reference voltage based on the sensor output signal having the first logic state, and decouple the output voltage from the reference voltage based on the sensor output signal having the second logic state.

In an embodiment, a voltage regulation circuit is disclosed. The regulation circuit includes a voltage regulator configured to provide an output voltage and a control circuit, coupled to the voltage regulator. The control circuit is configured to pull up the output voltage to a reference voltage responsive to the control circuit detecting that a first voltage level of the output voltage is lower than a predefined voltage level. The control circuit is configured to decouple the output voltage from the reference voltage responsive to the control circuit detecting that the first voltage level of the output voltage is higher than the predefined voltage level.

In another embodiment, a voltage regulation circuit includes a voltage regulator configured to provide an output voltage and a control circuit, coupled to the voltage regulator. The control circuit is configured to couple a load voltage to a reference voltage responsive to a first enable signal provided at a first input of the control circuit transitioning to a first predefined state. The control circuit is configured to decouple the load voltage from the reference voltage and couple the load voltage to the output voltage responsive to the first enable signal transitioning to a second predefined state and a second enable signal provided at a second input of the control circuit transitioning to a third predefined state.

In another embodiment, a method for controlling a voltage regulator includes injecting a charge into a node associated with an output voltage responsive to a first enable signal provided at a first input of the control circuit transitioning to a first predefined state and ceasing to inject a charge into the node associated with the output voltage responsive to the first enable signal transitioning to a second predefined state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A voltage regulation circuit, comprising:
   a voltage regulator that provides an output voltage; and
   a control circuit, coupled to the voltage regulator, that:
      pulls up the output voltage to a reference voltage responsive to the control circuit detecting that a first voltage level of the output voltage is lower than a predefined voltage level;
      decouples the output voltage from the reference voltage responsive to the control circuit detecting that the first voltage level of the output voltage is higher than the predefined voltage level;
      pulls down the output voltage to a second reference voltage responsive to the control circuit detecting that the first voltage level of the output voltage is higher than a second predefined voltage level; and
      decouples the output voltage from the second reference voltage responsive to the control circuit detecting that the first voltage level of the output voltage is lower than the second predefined voltage level.

2. The regulation circuit of claim 1, wherein the control circuit comprises a plurality of control circuit instances coupled to a plurality of memory banks, wherein, for each memory bank of the plurality of memory banks, a control circuit instance of the plurality of control circuit instances is dedicatedly coupled to the memory bank, and wherein each control circuit instance is configured as the control circuit.

3. The regulation circuit of claim 1, wherein the control circuit comprises:
   a sensor circuit that:
      compares the first voltage level of the output voltage and the predefined voltage level; and
      generates, based on the comparison, a sensor output signal having either a first logic state and a second logic state; and
   a pull up device, coupled to the sensor circuit, configured to:
      pulls up the output voltage to the reference voltage based on the sensor output signal having the first logic state; and decouples the output voltage from the reference voltage based on the sensor output signal having the second logic state.

4. The regulation circuit of claim 3, wherein the sensor circuit is an operational amplifier, and the pull up device is a p-type metal-oxide-semiconductor (PMOS) transistor.

5. The regulation circuit of claim 1, wherein the control circuit:
couples a load voltage to a third reference voltage responsive to a first enable signal provided at a first input of the control circuit transitioning to a first predefined state; and
decouples the load voltage from the third reference voltage and couples the load voltage to the output voltage responsive to the first enable signal transitioning to a second predefined state and a second enable signal provided at a second input of the control circuit transitioning to a third predefined state.

6. The regulation circuit of claim 1, wherein the control circuit provides an injection charge responsive to an enable signal provided at an input of the control circuit transitioning to a predetermined state.

7. A voltage regulation circuit, comprising:
a voltage regulator configured to provide an output voltage; and
a control circuit, coupled to the voltage regulator, that:
couples a load voltage to a reference voltage responsive to a first enable signal provided at a first input of the control circuit transitioning to a first predefined state; and
decouples the load voltage from the reference voltage and couples the load voltage to the output voltage responsive to the first enable signal transitioning to a second predefined state and a second enable signal provided at a second input of the control circuit transitioning to a third predefined state.

8. The regulation circuit of claim 7, wherein the control circuit comprises a plurality of control circuit instances coupled to a plurality of memory banks, wherein, for each memory bank of the plurality of memory banks, a control circuit instance of the plurality of control circuit instances is dedicatedly coupled to the memory bank, and wherein each control circuit instance is configured as the control circuit.

9. The regulation circuit of claim 7, wherein the control circuit comprises:
a first pull up device that:
couples the load voltage to the reference voltage based on the first enable signal transitioning to the first predefined state; and
decouples the load voltage from the reference voltage based on the first enable signal transitioning to the second predefined state; and
a second pull up device configured to couple the load voltage to the output voltage based on the second enable signal of the control circuit transitioning to the third predefined state.

10. The regulation circuit of claim 9, wherein each of the first pull up device and the second pull up device is a p-type metal-oxide-semiconductor (PMOS) transistor.

11. The regulation circuit of claim 7, wherein the control circuit:
pulls up the output voltage to a second reference voltage responsive to the control circuit detecting that a first voltage level of the output voltage is lower than a predefined voltage level; and
decouples the output voltage from the second reference voltage responsive to the control circuit detecting that the first voltage level of the output voltage is higher than the predefined voltage level.

12. The regulation circuit of claim 7, wherein the control circuit:
pulls down the output voltage to a second reference voltage responsive to the control circuit detecting that a first voltage level of the output voltage is higher than a predefined voltage level; and
decouples the output voltage from the second reference voltage responsive to the control circuit detecting that the first voltage level of the output voltage is lower than the predefined voltage level.

13. The regulation circuit of claim 7, wherein the control circuit provides an injection charge responsive to an enable signal provided at a third input of the control circuit transitioning to a predetermined state.

14. A method for controlling a voltage regulator, comprising:
injecting a charge into a node associated with an output voltage responsive to a first enable signal transitioning to a first predefined state; and
ceasing to inject the charge into the node associated with the output voltage responsive to the first enable signal transitioning to a second predefined state;
pulling down the output voltage to a reference voltage responsive to detecting that a first voltage level of the output voltage is higher than a predefined voltage level; and
decoupling the output voltage from the reference voltage responsive to detecting that the first voltage level of the output voltage is lower than the predefined voltage level.

15. The method of claim 14, further comprising:
monitoring the first voltage level of the output voltage;
pulling up the output voltage to a second reference voltage responsive to detecting that the first voltage level of the output voltage is lower than a second predefined voltage level; and
decoupling the output voltage from the second reference voltage responsive to detecting that the first voltage level of the output voltage is higher than the second predefined voltage level.

16. The method of claim 14, further comprising:
monitoring, for each memory bank of a plurality of memory banks, a dedicated voltage level of a dedicated output voltage coupled to memory bank;
pulling up the dedicated output voltage to a second reference voltage responsive to detecting that the dedicated voltage level of the dedicated output voltage is lower than a second predefined voltage level; and
decoupling the dedicated output voltage from the second reference voltage responsive to detecting that the dedicated voltage level of the dedicated output voltage is higher than the second predefined voltage level.

17. The method of claim 14, further comprising:
comparing the first voltage level of the output voltage and a second predefined voltage level;
generating, based on the comparison, a sensor output signal having either a first logic state and a second logic state;
pulling up the output voltage to a second reference voltage based the sensor output signal having the first logic state; and
decoupling the output voltage from the second reference voltage based on the sensor output signal having the second logic state.

18. The method of claim 14, further comprising:
coupling a load voltage to a second reference voltage responsive to a second enable signal provided at a second input transitioning to a third predefined state; and
decoupling the load voltage from the second reference voltage and coupling the load voltage to the output voltage responsive to the second enable signal transitioning to a fourth predefined state and a third enable signal provided at a third input transitioning to a fifth predefined state.

19. The voltage regulation circuit of claim 1, wherein the predefined voltage level is temperature compensated.

20. The voltage regulation circuit of claim 7, wherein the first predefined state includes a voltage level below zero volts.

\* \* \* \* \*